United States Patent
Cho et al.

(10) Patent No.: US 7,649,784 B2
(45) Date of Patent: Jan. 19, 2010

(54) MEMORY CELL PROGRAMMING METHODS CAPABLE OF REDUCING COUPLING EFFECTS

(75) Inventors: Kyoung-Iae Cho, Yongin-si (KR);
Jae-woong Hyun, Uijeongbu-si (KR);
Sung-jae Byun, Yongin-si (KR);
Kyu-charn Park, Pyeongtaek-si (KR);
Yoon-dong Park, Yongin-si (KR);
Choong-ho Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 201 days.

(21) Appl. No.: 12/000,493

(22) Filed: Dec. 13, 2007

(65) Prior Publication Data

US 2008/0170434 A1    Jul. 17, 2008

(30) Foreign Application Priority Data

Dec. 28, 2006    (KR) .................. 10-2006-0136822

(51) Int. Cl.
*G11C 11/03*    (2006.01)
(52) U.S. Cl. ..................... 365/185.24; 365/185.02; 365/185.11; 365/185.18; 365/185.27
(58) Field of Classification Search ............ 365/185.24, 365/185.02, 185.11, 185.18, 185.27
See application file for complete search history.

(56) References Cited

U.S. PATENT DOCUMENTS

| | | | |
|---|---|---|---|
| 6,288,935 B1 | 9/2001 | Shibata et al. | |
| 6,657,891 B1 | 12/2003 | Shibata et al. | |
| 7,489,544 B2 * | 2/2009 | Kim et al. | 365/185.03 |
| 7,554,859 B2 * | 6/2009 | Choi | 365/189.05 |
| 2006/0114720 A1 | 6/2006 | Shibata et al. | |

FOREIGN PATENT DOCUMENTS

EP    0 797 212 A2    9/1997

OTHER PUBLICATIONS

European Search Report (dated May 14, 2008) for counterpart European Patent Application No. 07150250.4-2210 is provided for the purposes of certification under 37 C.F.R. §§ 1.97(e).

* cited by examiner

*Primary Examiner*—Pho M. Luu
(74) *Attorney, Agent, or Firm*—Harness, Dickey & Pierce, P.L.C.

(57) ABSTRACT

In a memory cell programming method, first through n-th programming operations are performed to program first through n-th bits of the n bits of data using the plurality of threshold voltage distributions. The first through n-th programming operations are performed sequentially. A threshold voltage difference between threshold voltage distributions used in the n-th programming operation is less than or equal to at least one threshold voltage difference between threshold voltage distributions used in the first through (n−1)-th programming operations.

20 Claims, 5 Drawing Sheets

FIG. 9

| | BINARY CODE (FIG. 6) | | GRAY CODE (FIG. 7) | | MSYSTEMS' CODE (FIG. 8) | | MSB'S CODE (FIG. 5) | |
|---|---|---|---|---|---|---|---|---|
| | PROGRAM TIME | READ TIME | PROGRAM TIME | READ TIME | PROGRAM TIME | READ TIME | PROGRAM TIME | READ TIME |
| DISTRIBUTION = 4.0V | 21.2ms | 130us | 21.2ms | 75us | 21.2ms | 75us | 21.2ms | 130us |
| DISTRIBUTION = 5.0V | 26.4ms | 130us | 26.4ms | 75us | 26.4ms | 75us | 26.4ms | 130us |

MEMORY CELL PROGRAMMING METHODS CAPABLE OF REDUCING COUPLING EFFECTS

PRIORITY STATEMENT

This non-provisional patent application claims priority under 35 U.S.C. § 119 to Korean Patent Application No. 10-2006-0136822, filed on Dec. 28, 2006, in the Korean Intellectual Property Office, the entire contents of which is incorporated herein by reference.

BACKGROUND

Description of the Conventional Art

A non-volatile memory device may electrically erase and program data, but may preserve stored data even without application of a supply voltage. An example, non-volatile memory device is a flash memory.

A memory cell may include a cell transistor having a control gate, a floating gate, a source and a drain. The cell transistor may be programmed or erased using a Fowler-Nordheim (F-N) tunneling mechanism.

An example erase operation of the cell transistor may be performed by applying a ground voltage to the control gate of the cell transistor and a voltage higher than a supply voltage to a semiconductor substrate (or a bulk). Under an erase bias condition, a relatively large voltage difference between the floating gate and the substrate may cause a relatively strong electric field there between. As a result, electrons in the floating gate may discharge to the substrate due to F-N tunneling. As a result, the threshold voltage of the erased cell transistor may decrease.

In an example, program operation, a voltage higher than the supply voltage may be applied to the control gate and a ground voltage may be applied to the drain, the source and the substrate. In a program bias condition, electrons may be injected to the floating gate of the cell transistor through F-N tunneling. As a result, a threshold voltage of the programmed cell transistor may increase.

FIG. 1 is a view for explaining the structure and operation of a memory cell included in a non-volatile memory device.

As illustrated in FIG. 1, electrons may be injected to the floating gate FG of the memory cell included in the non-volatile memory device. A state in which electrons may be injected to the floating gate FG is referred to as a "program state." A state in which electrons may be erased from the floating gate FG is referred to as an "erase state."

In the program state, a threshold voltage of the floating gate FG may be higher than about "0," or positive. In the erase state, a threshold voltage of the floating gate FG may be lower than "0," or negative.

To improve density of flash memories, a multi-level flash memory may be used. In a multi-level flash memory, a plurality of data bits (e.g., multi-bit data) may be stored in a single memory cell. For example, multi-bit data (e.g., two or more bits) may be stored in each memory cell. A memory cell storing multi-bit data is referred to as a "multi-level cell," and a memory cell storing a single-bit data is referred to as a "single-level cell." The multi-level cell may store multi-bit data utilizing two or more threshold voltages. Each of threshold voltages may be included in the corresponding threshold voltage distribution of a plurality of threshold voltages. A multi-level cell may also have two or more data storage states corresponding to the two or more threshold voltage distributions. An example in which 2 bits of data are stored in a memory cell of a multi-level flash memory will be described.

However, three or more bits of data may be stored in a memory cell of the multi-level flash memory.

A multi-level cell storing 2 bit data may have four data storage states, for example, "11", "01", "10", and "00". In this example, "11" represents an erased state, and "01", "10", and "00" represent programmed states.

The four data storage states may correspond to respective threshold voltage distributions of the multi-level cell. For example, if the threshold voltage distributions of the multi-level cell are "VTH1-VTH2", "VTH3-VTH4", "VTH5-VTH6", and "VTH7-VTH8", the data storage states "11", "01", "10", and "00" may correspond to voltage distributions "VTH1-VTH2", "VTH3-VTH4", "VTH5-VTH6", and "VTH7-VTH8", respectively. In this example, 2 bit data may be stored in the multi-level cell according to threshold voltages "11", "01", "10", and "00".

FIG. 2 is a view for explaining an example operation of a multi-level cell included in a non-volatile memory device.

FIG. 2 illustrates an erase state in which no electrons are in the floating gate FG of the multi-level cell, a first program state in which a first portion of electrons are injected to the floating gate FG of the multi-level cell, a second program state in which a second portion of electrons are injected to the floating gate FG of the multi-level cell, and a third program state in which a relatively large amount of electrons are injected to the floating gate FG of the multi-level cell. From the erase state to the third program state, threshold voltages may increase gradually.

FIG. 3 illustrates a plurality of threshold voltage distributions for the conventional multi-level cell illustrated in FIG. 2.

Referring to FIG. 3, 16 threshold voltage distributions of the conventional multi-level cell may represent 4-bit data. The 16 threshold voltage distributions may correspond to combinations of 4-bit codes.

Memory cell programming may be performed by changing a threshold voltage of a memory cell. Changing a threshold voltage of a programmed memory cell may generate a coupling effect in memory cells adjacent to the programmed memory cell, which may change threshold voltages of the adjacent memory cells. In this example, the larger the change of the threshold voltage when programming, the greater the coupling effect. In addition, a threshold voltage change at the latter half of programming may cause a greater coupling effect than a threshold voltage change at the beginning of programming.

SUMMARY

Example embodiments relate to memory cells and memory cell programming methods, for example, memory cells and memory cell programming methods capable of reducing a coupling effect due to a change in threshold voltage during memory cell programming.

Example embodiments provide memory cells and memory cell programming methods in which threshold voltage differences between threshold voltages used to program subsequent bits may be sequentially decreased.

According to at least one example embodiment, a memory cell programming method for programming n bits of data in a memory cell may have a plurality of threshold voltage distributions. The memory cell programming method may include a first through n-th programming operations. The programming operations may be performed sequentially.

According to at least some example embodiments, the first through n-th programming operations may program first through n-th bits, respectively, using the plurality of threshold voltage distributions. A threshold voltage difference between threshold voltage distributions used in the n-th programming operation may be smaller than at least one threshold voltage difference of threshold voltage differences between threshold voltage distributions used in the remaining first through (n−1)-th programming operations. Threshold voltage differences between threshold voltage distributions used in the first through n-th programming operations may decrease (e.g., sequentially).

According to at least some example embodiments, a threshold voltage difference between threshold voltage distributions used in the first programming operation may be greater than at least one threshold voltage difference among differences between threshold voltage distributions used in the second through n-th programming operations. A threshold voltage difference between threshold voltage distributions used in the first programming operation may be the maximum voltage difference of threshold voltage differences between threshold voltage distributions used in the first through n-th programming operations.

According to example embodiments, the memory cell may be a non-volatile memory cell in which multi-bit data (e.g., n bits of data) may be stored. The memory cell may be a multi-level flash memory cell in which multi-bit (e.g., n bits of data) may be stored. The memory cell has $2^n$ threshold voltage distributions classified according to threshold voltages.

At least one other example embodiment provides a memory cell programming method. According to at least this example embodiment, first through n-th programming operations may be performed sequentially. The first through n-th programming operations may program first through n-th bits, respectively, using a plurality of threshold voltage distributions.

According to at least some example embodiments, the first programming operation may program the first bit, using a first intermediate threshold voltage distribution located in a middle portion of the plurality of threshold voltage distributions, and a minimum threshold voltage distribution of the plurality of threshold voltage distributions. The second programming operation may program the second bit, using the minimum threshold voltage distribution and a second intermediate threshold voltage distribution located in the middle of the minimum threshold voltage distribution and the first intermediate threshold voltage distribution, when the first bit is programmed with the minimum threshold voltage distribution. The second programming operation may program the second bit, using the first intermediate threshold voltage distribution and a third intermediate threshold voltage distribution located in a middle portion of the first intermediate threshold voltage distribution and the maximum threshold voltage distribution, when the first bit is programmed with the first intermediate threshold voltage distribution.

At least one other example embodiment provides a memory cell programming method including first through n-th programming operations. According to at least this example embodiment, a first programming operation may program a first bit of the data using the first threshold voltage distribution and a $(1/2 \times 2^n + 1)$-th threshold voltage distribution. The second programming operation may program a second bit of the data using the first threshold voltage distribution, a $(1/2^2 \times 2^n + 1)$-th threshold voltage distribution, a $(2/2^2 \times 2^n + 1)$-th threshold voltage distribution, and a $(3/2^2 \times 2^n + 1)$-th threshold voltage distribution. An i-th programming operation may program an i-th bit of the data using each threshold voltage distribution between the first threshold voltage distribution and a $((2^i - 1)/2^{i \times 2^n} + 1)$-th threshold voltage distribution.

For example, the i-th programming operation may program an i-th bit of the data using the first threshold voltage distribution, a $(1/2^i \times 2^n + 1)$-th threshold voltage distribution, a $(2/2^i \times 2^n + 1)$-th threshold voltage distribution, . . . , and a $((2^i - 1)/2^i \times 2^n + 1)$-th threshold voltage distribution. The number i may be a natural number greater than 2 and smaller than n. The n-th programming operation may program an n-th bit of the data using each threshold voltage distribution between the first threshold voltage distribution and a $((2^n - 1)/2^n \times 2^n + 1)$-th threshold voltage distribution. For example, the n-th programming operation may program an n-th bit of the data using the first threshold voltage distribution, a $(1/2^n \times 2^n + 1)$-th threshold voltage distribution, a $(2/2^n \times 2^n + 1)$-th threshold voltage distribution, . . . , and a $((2^n - 1)/2^n \times 2^n + 1)$-th threshold voltage distribution.

BRIEF DESCRIPTION OF THE DRAWINGS

Example embodiments will become more apparent by describing in detail the example embodiments shown in the attached drawings in which:

FIG. 9 is a table showing programming times and reading times which are required in the memory cell programming method according to an example embodiment.

DETAILED DESCRIPTION OF EXAMPLE EMBODIMENTS

Figure 1:
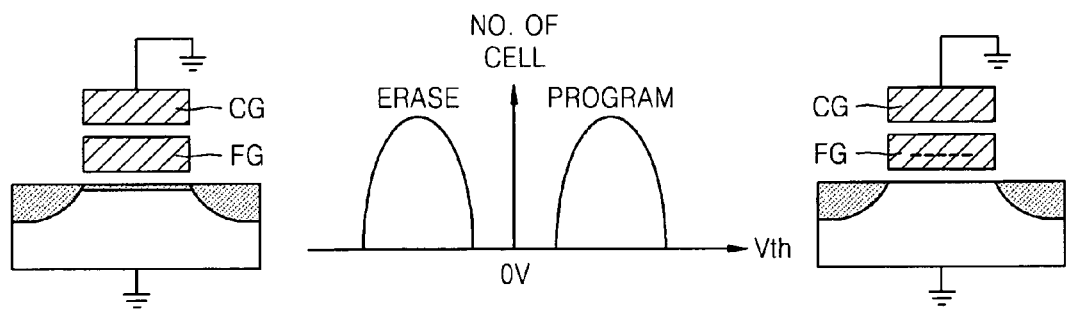
FIG. 1 is a view for explaining the structure and operation of a conventional non-volatile memory cell.
Figure 2:
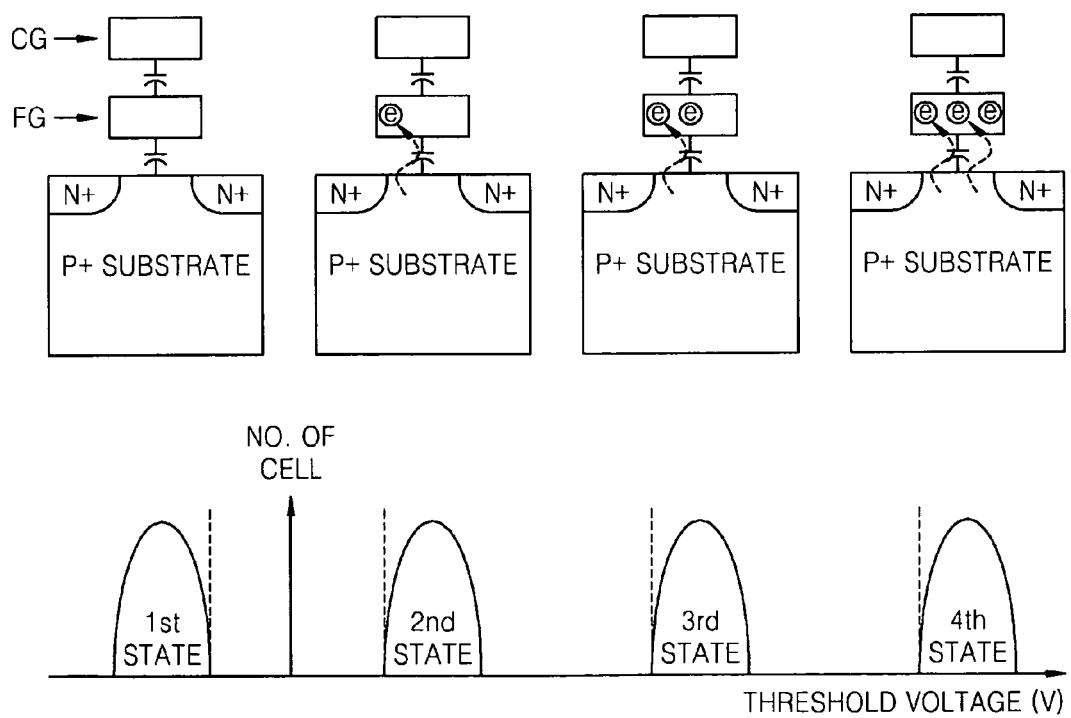
FIG. 2 is a view for explaining the operation of a conventional non-volatile multi-level cell.
Figure 3:
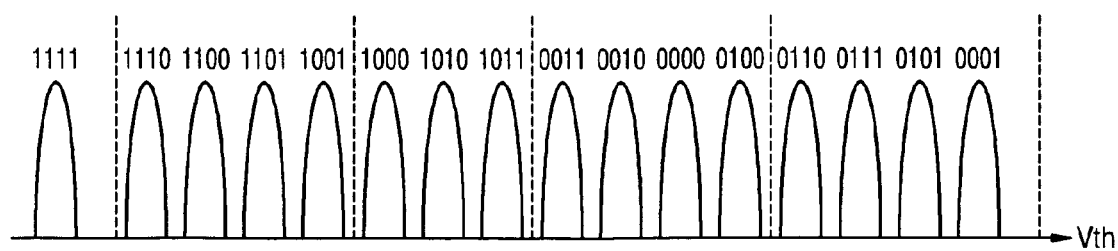
FIG. 3 illustrates a plurality of conventional threshold voltage distributions for the conventional multi-level cell illustrated in FIG. 2.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 4:
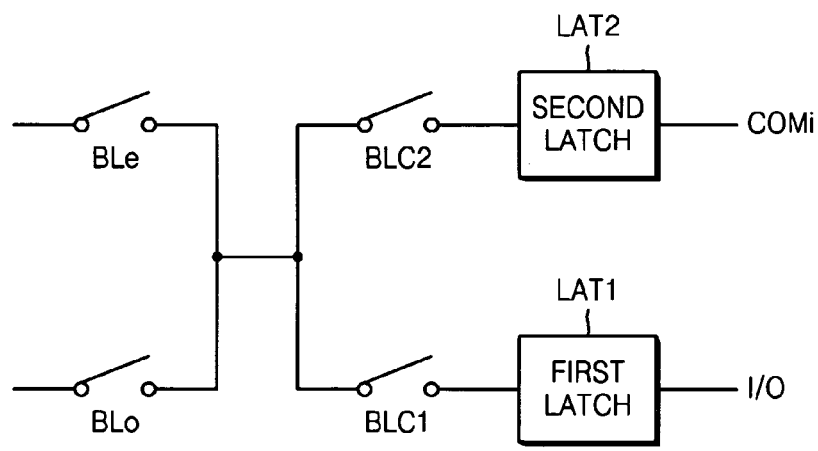
FIG. 4 is a block diagram of a non-volatile memory device according to an example embodiment.

FIG. 4 is a block diagram of a non-volatile memory device according to an example embodiment.

Referring to FIG. 4, a non-volatile memory device may program data in a memory cell using a first latch LAT1 and a second latch LAT2. When programming a second bit of data in the memory cell, a first bit of the data may be latched by the first latch LAT1 and a second bit of the data may be latched by the second latch LAT2. The non-volatile memory device may program the second bit of data stored in the second latch LAT2 in the memory cell, with reference to the first bit of the data stored in the first latch LAT1. The threshold voltage of the second bit may be determined based on the threshold voltage of the first bit.

In memory cell programming methods according to example embodiments, multi-bit data (e.g., n bits of data, where n is a natural number) may be programmed to a memory cell having a plurality of threshold voltage distributions.

An example embodiment of a memory cell programming method may include first through n-th programming operations. The first through n-th programming operations may be performed sequentially. The first through n-th programming operations may program first through n-th bits, respectively, using a plurality of threshold voltage distributions.

A threshold voltage difference between threshold voltage distributions used in the n-th programming operation may be less than at least one of threshold voltage differences between threshold voltage distributions used in the previous first through (n−1)-th programming operations.

The threshold voltage differences between the threshold voltage distributions used in the first through n-th programming operations may be reduced (e.g., sequentially reduced). According to at least one example embodiment, the threshold voltage difference used in the first programming operation may be greater than at least one of the threshold voltage differences used in the second through n-th programming operations. For example, the threshold voltage difference used in the first programming operation may be a maximum threshold voltage difference. According to at least one example embodiment, the threshold voltage difference used in the n-th programming operation may be less than at least one of the threshold voltage differences used in the first through (n−1)-th programming operations. For example, the threshold voltage difference used in the n-th programming operation may be the minimum threshold voltage difference.

A threshold voltage difference between threshold voltage distributions used in an i-th programming operation (where i is a natural number greater than 1 and smaller than n), may be less than or equal to a threshold voltage difference used in a j-th programming operation (where j is a natural number greater than 1 and less than i). For example, a threshold voltage difference used in a subsequent programming operation may be less than or equal to a threshold voltage difference used in a previous programming operation.

The threshold voltage difference between the threshold voltage distributions used in the n-th programming operation may be the smallest of the threshold voltage differences between the threshold voltage distributions used in the first through n-th programming operations. The threshold voltage difference between the threshold voltage distributions used in the n-th programming operation may be less than or equal to at least one (e.g., any one of) the threshold voltage differences between the threshold voltage distributions used in the first through (n−1)-th programming operations.

A threshold voltage difference between threshold voltage distributions used in the first programming operation may be greater than at least one of threshold voltage differences between threshold voltage distributions used in the second through n-th programming operations. For example, the threshold voltage difference between the threshold voltage distributions used in the first programming operation may be the greatest of the threshold voltage differences between the threshold voltage distributions used in the first through n-th programming operations.

The memory cell may be a non-volatile memory cell in which multi-bit data (e.g., n bits of data) may be stored. The memory cell may be a multi-level flash memory cell in which multi-bit data (e.g., n bits of data) may be stored. Memory cells according to example embodiments may have $2^n$ threshold voltage distributions classified according to threshold voltages.

For example purposes, a memory cell according to an example embodiment will be discussed herein as having 16 threshold voltage distributions being capable of storing 4 bits of data. However, example embodiments are not limited to the 16 threshold voltage distributions and 4 bits of data.

Figure 5:
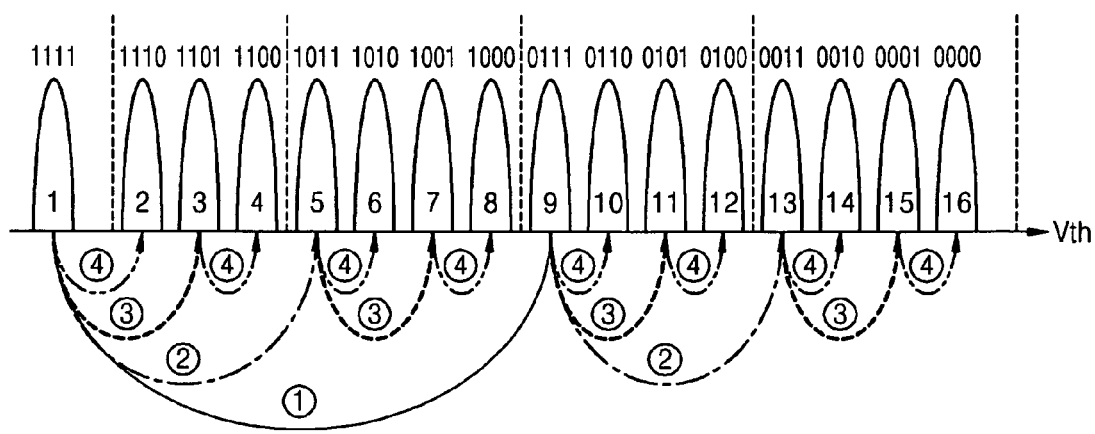
FIG. 5 is a view for explaining a memory cell programming method according to an example embodiment.

FIG. 5 is a view for explaining a memory cell programming method according to an example embodiment. The memory cell programming method shown in FIG. 5 will be described assuming n=4. Also, in FIG. 5, a minimum threshold voltage distribution is referred to as a first threshold voltage distribution, and a maximum threshold voltage distribution is referred to as a sixteenth threshold voltage distribution. Each threshold voltage distribution is shown with the corresponding code thereon. However, the corresponding code is provided as an example and different codes may also be used.

A memory cell programming method according to an example embodiment includes first through n-th programming operations performed sequentially. The first through n-th programming operations may be used to program first through n-th bits, respectively, using a plurality of threshold voltage distributions.

Referring to FIG. 5, the first programming operation may program a first bit, using a first intermediate threshold voltage distribution positioned in the middle of the plurality of threshold voltage distributions and a lowest threshold voltage distribution which is the lowest threshold voltage distribution of the plurality of threshold voltage distributions. For example, referring to FIG. 5, the first intermediate threshold voltage distribution may be the ninth threshold voltage distribution, and the lowest threshold voltage distribution may be the first threshold voltage distribution. For example, the first programming operation may program the first bit, using the first threshold voltage distribution and the ninth threshold voltage distribution.

The second programming operation may program a second bit using the minimum threshold voltage distribution and a second intermediate threshold voltage distribution. For example, when the first bit is programmed with the minimum threshold voltage distribution, the second intermediate threshold voltage distribution may be between the middle of the lowest threshold voltage distribution and the first intermediate threshold voltage distribution. The second programming operation may program the second bit using the first intermediate threshold voltage distribution and a third intermediate threshold voltage distribution. For example, when the first bit is programmed with the first intermediate threshold voltage distribution, the third intermediate voltage distribution may be between the middle of the first intermediate voltage distribution and the maximum threshold voltage distribution.

For example, referring to FIG. 5, the second threshold voltage distribution may be the fifth threshold voltage distribution, and the third threshold voltage distribution may be the thirteenth threshold voltage distribution. For example, when the first bit is programmed with the first threshold voltage distribution, the second programming operation may program the second bit using the first threshold voltage distribution and the fifth threshold voltage distribution. When the first bit is programmed with the ninth threshold voltage distribution, the second programming operation may program the second bit using the ninth threshold voltage distribution and the thirteenth threshold voltage distribution.

In this example, the third and fourth programming operations may be performed. For example, still referring again to FIG. 5, the third programming operation may program a third bit using the first threshold voltage distribution and the third threshold voltage distribution, using the fifth threshold voltage distribution and the seventh threshold voltage distribution, using the ninth threshold voltage distribution and the eleventh threshold voltage distribution, or using the thirteenth threshold voltage distribution and the fifteenth threshold voltage distribution.

The fourth programming operation may program a fourth bit using the first threshold voltage distribution and the second threshold voltage distribution, using the third threshold voltage distribution and the fourth threshold voltage distribution, using the fifth threshold voltage distribution and the sixth threshold voltage distribution, using the seventh threshold voltage distribution and the eighth threshold voltage distribution, using the ninth threshold voltage distribution and the tenth threshold voltage distribution, using the eleventh threshold voltage distribution and the twelfth threshold voltage distribution, using the thirteenth threshold voltage distribution and the fourteenth threshold voltage distribution, or using the fifteenth threshold voltage distribution and the sixteenth threshold voltage distribution.

In memory cell programming methods according to example embodiments, threshold voltage differences between threshold voltage distributions used to program bits sequentially may decrease (e.g., sequentially decrease). For example, a threshold voltage difference between the first threshold voltage distribution and the second threshold voltage distribution used to program the fourth bit may be less than a threshold voltage difference between the first threshold voltage distribution and the ninth threshold voltage distribution used to program the first bit. A threshold voltage difference between the first threshold voltage distribution and the second threshold voltage distribution used to program the fourth bit may be less than a threshold voltage difference between the first threshold voltage distribution and the third threshold voltage distribution used to program the third bit. Accordingly, a coupling effect in which a threshold voltage change for programming a specific memory cell changes the threshold voltages of its peripheral memory cells may be reduced.

In a conventional memory cell programming method, a threshold voltage difference between threshold voltage distributions used to program a subsequent bit (e.g., the second bit), may be greater than a threshold voltage difference between threshold voltage distributions used to program a previous bit (e.g., the first bit). In memory cell programming methods according to example embodiments, a threshold voltage difference between threshold voltage distributions used to program a subsequent bit (e.g., the second bit) may be less than a threshold voltage difference between threshold voltage distributions used to program a previous bit (e.g., the first bit). Accordingly, in memory cell programming methods according to example embodiments, as programming proceeds, coupling effects due to a change in threshold voltage may be reduced.

In memory cell programming methods according to example embodiments, codes corresponding to threshold voltage distributions used to program respective bits may have at least one bit in common. For example, referring to FIG. 5, codes corresponding to threshold voltage distributions positioned between the lowest threshold voltage distribution (e.g., the first threshold voltage distribution) and the first intermediate threshold voltage distribution (e.g., the ninth threshold voltage distribution) may have at least one bit in common. For example, the first through eighth threshold voltage distributions may have a code whose first bit value is "1". Also, codes corresponding to threshold voltage distributions positioned between the first intermediate threshold voltage distribution and the highest threshold voltage distribution may have at least one bit in common. Similarly, the ninth through sixteenth threshold voltage distributions may have a code whose first bit value is "0".

Codes corresponding to threshold voltage distributions positioned between the lowest threshold voltage distribution (e.g., the first threshold voltage distribution) and the second intermediate threshold voltage distribution (e.g., the fifth threshold voltage distribution) may have at least one bit (e.g., two bits) in common. For example, the first through fourth threshold voltage distributions may have a code whose first and second bit value is "11". Similarly, codes corresponding to threshold voltage distributions positioned between the second intermediate threshold voltage distribution (e.g., the fifth threshold voltage distribution) and the first intermediate threshold voltage distribution (e.g., the ninth threshold voltage distribution) may have at least one bit (e.g., two bits) in common. For example, the fifth through eighth threshold voltage distributions may have a code whose first and second bit value is "10".

Codes corresponding to threshold voltage distributions located between the first intermediate threshold voltage distribution (e.g., the ninth threshold voltage distribution) and the third intermediate threshold voltage distribution (e.g., the thirteenth threshold voltage distribution) may have at least one bit (e.g., two bits) in common. For example, the ninth through thirteenth threshold voltage distributions may have a code whose first and second bit value is "01". Codes corresponding to threshold voltage distributions positioned between the third intermediate threshold voltage distribution (e.g., the thirteen threshold voltage distribution) and the highest threshold voltage distribution (e.g., the sixteenth threshold voltage distribution) may have at least one bit (e.g., two bits) in common. For example, the thirteenth through sixteenth threshold voltage distributions may have a code whose first and second bit value is "00".

Figure 6:
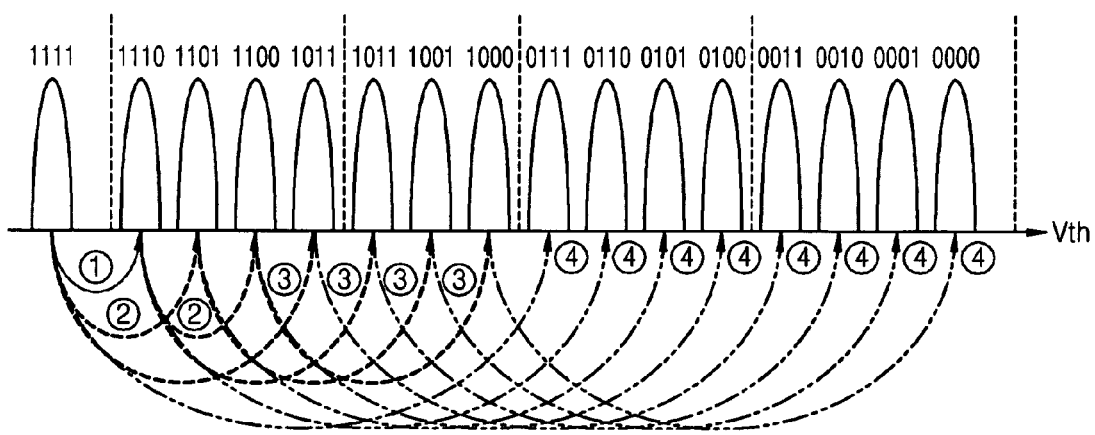
FIG. 6 is a comparative art example memory cell programming method for explaining memory cell programming methods according to example embodiments.
Figure 7:
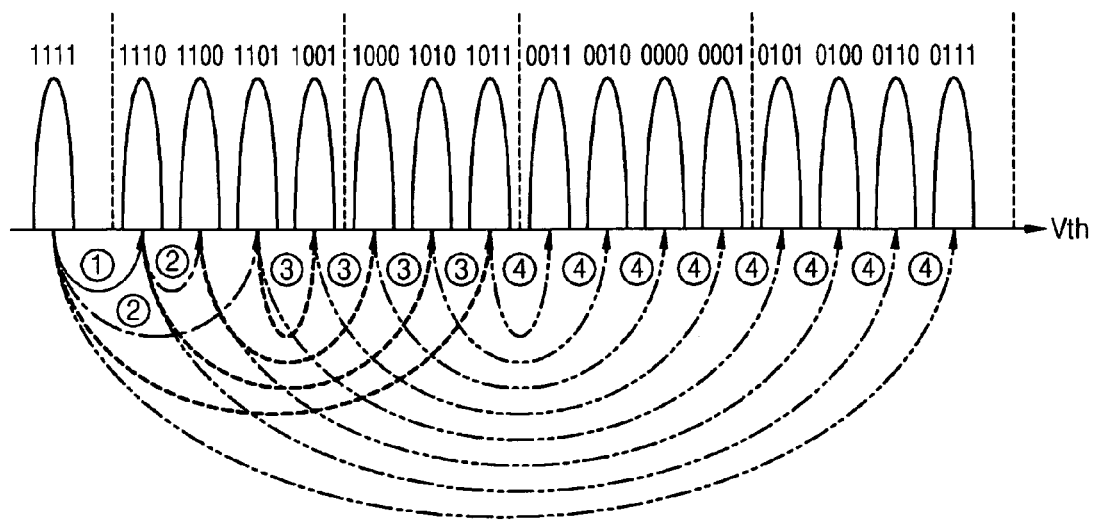
FIG. 7 is a comparative art example memory cell programming method for explaining memory cell programming methods according to example embodiments.
Figure 8:
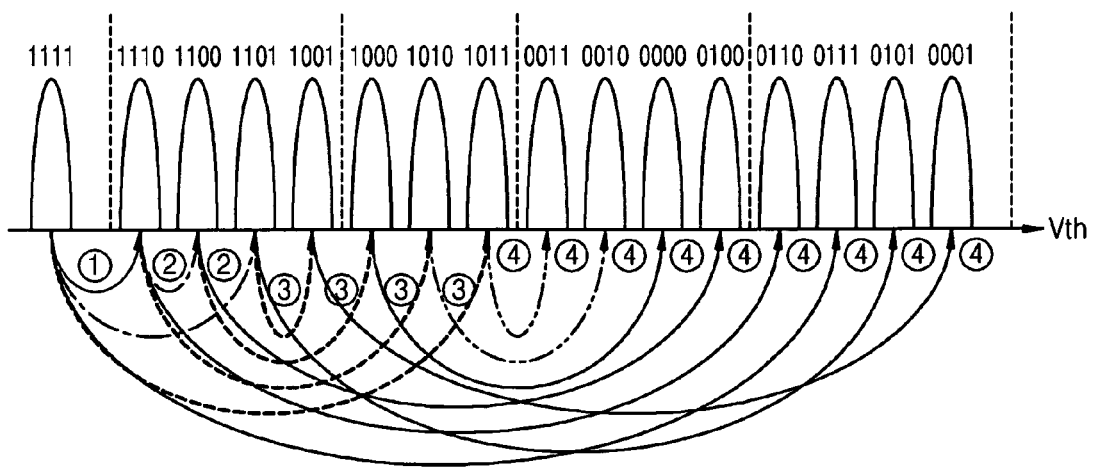
FIG. 8 is a comparative art example memory cell programming method for explaining memory cell programming methods according to example embodiments.

FIGS. 6-8 are comparative art example memory cell programming methods for explaining memory cell programming methods according to example embodiments. The comparative art examples as shown in FIGS. 6-8 are discussed herein to be compared with example embodiments.

Referring to FIGS. 6, 7 and 8, in the comparative example memory cell programming methods, data is stored sequentially from a Least Significant Bit (LSB) to a Most Significant Bit (MSB). Accordingly, a threshold voltage difference between threshold voltage distributions used to program the MSB is greater than a threshold voltage difference between threshold voltage distributions used to program the LSB.

FIG. 9 is a table showing example programming times and reading times used in memory cell programming methods according to example embodiments.

Referring to FIG. 9, the memory cell programming method according to the above-discussed example embodiment and the comparative art memory cell programming methods shown in FIGS. 6, 7 and 8 may have the same or substantially the same programming time. For example, the memory cell programming method according to the above-discussed example embodiment may reduce a coupling effect due to a change in threshold voltage without increasing programming time.

In a memory cell programming method according to another example embodiment, a plurality of (e.g., n) data bits may be programmed in a memory cell having first through $2^n$ threshold voltage distributions. Hereinafter, the threshold voltages of the first through $2^n$ threshold voltage distributions are assumed to rise sequentially.

An example embodiment of a memory cell programming method includes first through n-th programming operations. During a first programming operation, a first bit of data may be programmed using a first threshold voltage distribution and a $(1/2 \times 2^n+1)$-th threshold voltage distribution. For example, referring to FIG. 5 illustrating a case in which n=4, the first programming operation may program a first data bit using a first threshold voltage distribution and a ninth threshold voltage distribution.

The second programming operation may program a second data bit using a first threshold voltage distribution, a $(1/2^n \times 2^{n+1})$-th threshold voltage distribution, a $(2/2^2 \times 2^n+1)$-th threshold voltage distribution, and a $(3/2^2 \times 2^n+1)$-th threshold voltage distribution. The i-th programming operation (where i is a natural number greater than or less than n) may program an i-th data bit using the first threshold voltage distribution, a $(1/2^i \times 2^n+1)$-th threshold voltage distribution, a $(2/2^i \times 2^n+1)$-th threshold voltage distribution, and a $((2^i-1)/2^i \times 2^n+1)$-th threshold voltage distribution. The n-th programming operation may program an n-th data bit using the first threshold voltage distribution, a $(1/2^n \times 2^n+1)$-th threshold voltage distribution, a $(1/2^n \times 2^n+1)$-th threshold voltage distribution, ..., and a $((2^n-1)/2^2 \times 2^n+1)$-th threshold voltage distribution.

As described herein, in memory cell programming methods according to example embodiments, threshold voltage differences used to sequentially program data bits may be decreased (e.g., sequentially decreased), thereby reducing coupling effects in which a threshold voltage change for programming a specific memory cell changes the threshold voltages of its peripheral memory cells.

While the present invention has been particularly shown and described with reference to the example embodiments shown herein, it will be understood by those of ordinary skill in the art that various changes in form and details may be made therein without departing from the spirit and scope of the present invention as defined by the following claims.

What is claimed is:

1. A memory cell programming method for programming n bits of data in a memory cell having a plurality of threshold voltage distributions, the method comprising:
   first through n-th programming operations programming first through n-th bits of the n bits of data, the first through n-th programming operations being performed using the plurality of threshold voltage distributions and being performed sequentially; wherein
   a difference between threshold voltage distributions used in the n-th programming operation is less than or equal to at least one difference between threshold voltage distributions used in the first through (n−1)-th programming operations.

2. The memory cell programming method of claim 1, wherein differences between threshold voltage distributions used in the first through n-th programming operations decrease sequentially.

3. The memory cell programming method of claim 1, wherein a difference between threshold voltage distributions used in an i-th programming operation is less than or equal to a difference between threshold voltage distributions used in a j-th programming operation; wherein
   i is a natural number between 1 and n, and
   j is a natural number less than i.

4. The memory cell programming method of claim 1, wherein a difference between threshold voltage distributions used in the n-th programming operation is a minimum difference among differences between threshold voltage distributions used in the first through n-th programming operations.

5. The memory cell programming method of claim 1, wherein a difference between threshold voltage distributions used in the n-th programming operation is less than at least one difference between the threshold voltage distributions used in the first through (n−1)-th programming operations.

6. The memory cell programming method of claim 1, wherein a difference between threshold voltage distributions used in the first programming operation is greater than or equal to a difference between the threshold voltage distributions used in the second through n-th programming operations.

7. The memory cell programming method of claim 1, wherein a difference between threshold voltage distributions used in the first programming operation is a maximum difference among the differences between threshold voltage distributions used in the first through n-th programming operations.

8. The memory cell programming method of claim 1, wherein the memory cell is a non-volatile memory cell in which the n bits of data are stored.

9. The memory cell programming method of claim 1, wherein the memory cell is a multi-level flash memory cell in which the n bits of data are stored.

10. The memory cell programming method of claim 1, wherein the memory cell has $2^n$ threshold voltage distributions, the $2^n$ threshold voltage distributions being grouped according to threshold voltage.

11. A memory cell programming method for programming n bits of data in a memory cell having first through $2^n$-th threshold voltage distributions, the method comprising:
   a first programming operation programming a first bit of the data using a first threshold voltage distribution and a $(1/2 \times 2^n+1)$-th threshold voltage distribution;
   a second programming operation programming a second bit of the data using the first threshold voltage distribution, a $(1/2^2 \times 2^n+1)$-th threshold voltage distribution, a $(2/2^n \times 2^n+1)$-th threshold voltage distribution, and a $(3/2^2 \times 2^n+1)$-th threshold voltage distribution;
   an i-th programming operation programming a i-th bit of the data using each threshold voltage distribution between the first threshold voltage distribution, and a $((2^i-1)/2^i \times 2^n+1)$-th threshold voltage distribution, i being a natural number greater than 2 and less than n; and
   an n-th programming operation programming a n-th bit of the data using each threshold voltage distribution between the first threshold voltage distribution and a $((2^n-1)/2^n \times 2^n+1)$-th threshold voltage distribution; wherein
   threshold voltages of the first through $2^n$-th threshold voltage distributions increase sequentially.

12. The memory cell programming method of claim 11, wherein the second programming operation programs the second bit of the data using the first threshold voltage distribution and the $(1/2^n \times 2^n+1)$-th threshold voltage distribution, or using the $(2/2^n \times 2^n+1)$-th threshold voltage distribution and the $(3/2^2 \times 2^{n+1})$-th threshold voltage distribution, and
   the n-th programming operation programs the n-th bit of the data using the first threshold voltage distribution and the $(1/2^n \times 2^n+1)$-th threshold voltage distribution, using the $(2/2^n \times 2^n+1)$-th threshold voltage distribution and the $(3/2^n \times 2^n+1)$-th threshold voltage distribution, or using the $((2^n-2)/2^2 \times 2^n+1)$-th threshold voltage distribution and the $((2^n-1)/2^2 \times 2^n+1)$-th threshold voltage distribution.

13. A memory cell programming method for programming n bits of data in a memory cell having a plurality of threshold voltage distributions, the method comprising:
   first through n-th programming operations programming first through n-th bits of the n bits of data, respectively, using the plurality of threshold voltage distributions, the first through n-th programming operations being performed sequentially; wherein
   the first programming operation programs the first bit of data using a first intermediate threshold voltage distribution, the first intermediate threshold voltage distribution being between a portion of the plurality of threshold voltage distributions and a minimum threshold voltage distribution.

14. The memory cell programming method of claim 13, wherein codes corresponding to threshold voltage distributions positioned between the minimum threshold voltage distribution and the first intermediate threshold voltage distribution, have at least one bit value in common, and
   codes corresponding to threshold voltage distributions positioned between the first intermediate threshold voltage distribution and a maximum threshold voltage distribution have at least one bit value in common.

15. The memory cell programming method of claim 14, wherein the second programming operation includes,
   programming the second bit of data using the minimum threshold voltage distribution and a second intermediate threshold voltage distribution, the second intermediate threshold voltage distribution being between the minimum threshold voltage distribution and the first intermediate threshold voltage distribution when the first bit is programmed with the minimum threshold voltage distribution, or
   programming the second bit of the data using the first intermediate threshold voltage distribution and a third intermediate threshold voltage distribution, the third intermediate threshold distribution being between the first intermediate threshold voltage distribution and the maximum threshold voltage distribution, when the first bit is programmed with the first intermediate threshold voltage distribution.

16. The memory cell programming method of claim 15, wherein codes corresponding to threshold voltage distributions positioned between the minimum threshold voltage distribution and the second intermediate threshold voltage distribution have at least one bit value in common.

17. The memory cell programming method of claim 15, wherein codes corresponding to threshold voltage distributions positioned between the second intermediate threshold voltage distribution and the first intermediate threshold voltage distribution have at least one bit value in common.

18. The memory cell programming method of claim 15, wherein codes corresponding to threshold voltage distributions positioned between the first threshold voltage distribution and the third intermediate threshold voltage distribution have at least one bit value in common.

19. The memory cell programming method of claim 15, wherein codes corresponding to threshold voltage distributions positioned between the third intermediate threshold voltage distribution and the maximum threshold voltage distribution have at least one bit value in common.

20. The memory cell programming method of claim 13, wherein the memory cell is a multi-level flash memory cell in which the n bits of data are stored.

* * * * *